(12) United States Patent
Bodmann et al.

(10) Patent No.: US 7,503,790 B2
(45) Date of Patent: Mar. 17, 2009

(54) INDUSTRIAL AUTOMATION INPUT OUTPUT MODULE WITH ELASTOMERIC SEALING

(75) Inventors: Douglas R. Bodmann, Shaker Heights, OH (US); Douglas A. Lostoski, Richfield, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 11/824,987

(22) Filed: Jul. 3, 2007

(65) Prior Publication Data

US 2009/0008880 A1  Jan. 8, 2009

(51) Int. Cl.
*H01R 13/52* (2006.01)

(52) U.S. Cl. .................................. 439/271; 439/587

(58) Field of Classification Search ............. 439/271, 439/587

See application file for complete search history.

(56) References Cited

U.S. PATENT DOCUMENTS

| | | | | |
|---|---|---|---|---|
| 5,277,610 A | * | 1/1994 | Krehbiel et al. | 439/271 |
| 5,722,863 A | * | 3/1998 | Yanase | 439/718 |
| 6,039,592 A | * | 3/2000 | Shinchi | 439/271 |
| 6,443,764 B2 | * | 9/2002 | Makita | 439/587 |
| 6,881,101 B2 | | 4/2005 | Sichner et al. | |
| 6,916,194 B2 | | 7/2005 | Sichner et al. | |
| 7,021,974 B2 | | 4/2006 | Sichner et al. | |
| 2006/0292913 A1 | * | 12/2006 | Milton | 439/271 |

* cited by examiner

*Primary Examiner*—Tho D Ta
(74) *Attorney, Agent, or Firm*—Fay Sharpe LLP; R. Scott Speroff

(57) ABSTRACT

An industrial automation input output module is protected against ingress of water, oil, debris, dirt and other contaminants without use of a potting compound. An elastomeric main seal provides a fluid-tight connection between interfitted inner and outer housing members that define a housing of the module. The one-piece main seal includes an integral light pipe portion with at least one light pipe that communicates light from an LED or other light source to a visual indicator opening in the housing, and the light pipe portion is also sealed to the housing to prevent ingress of contaminants through the visual indicator opening. Connectors pass through a wall of the housing and connector seals are used to prevent ingress of contaminants between the connectors and the housing. The connectors are also secured against rotation relative to the housing.

16 Claims, 9 Drawing Sheets

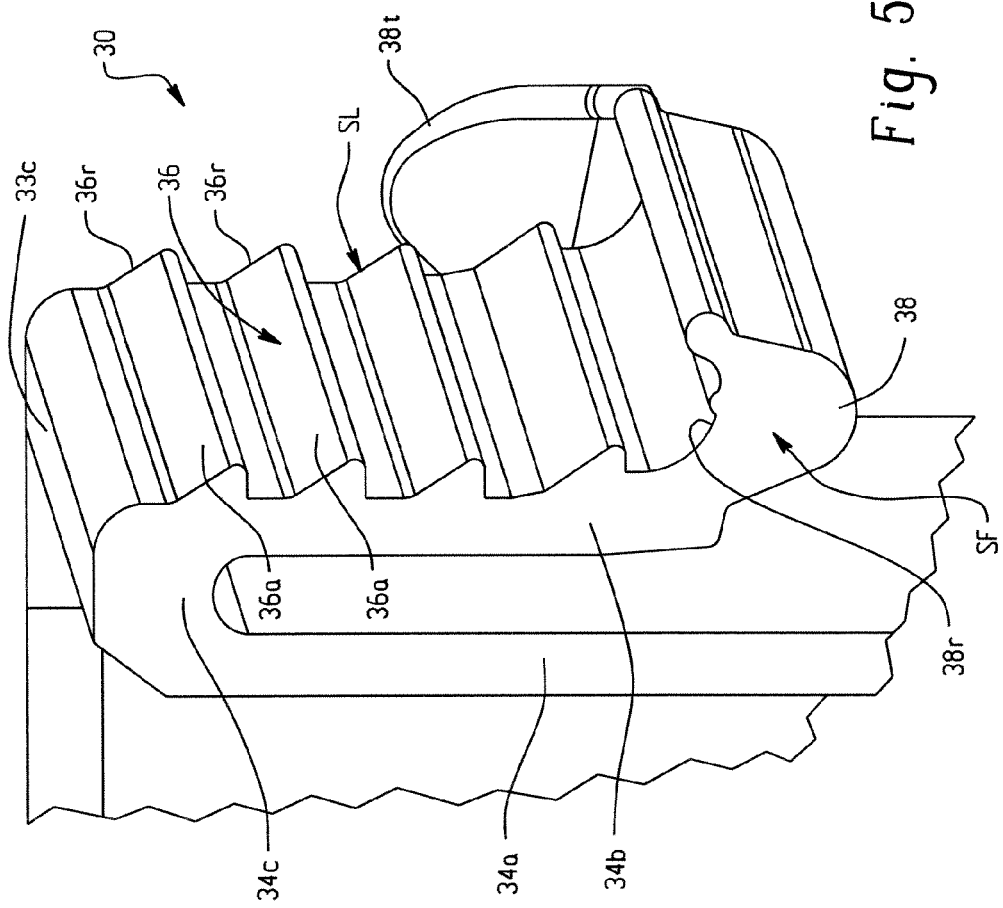

INDUSTRIAL AUTOMATION INPUT OUTPUT MODULE WITH ELASTOMERIC SEALING

FIELD

The present development relates to an industrial automation input output module for a distributed input output system that is highly resistant to ingress of water, oil, debris, dirt and other contaminants encountered in manufacturing and other environments without use of a potting compound. An industrial automation input output module formed in accordance with the present development meets ingress protection standards such as IP69/IP67.

BACKGROUND

FIG. 1 illustrates a known industrial automation input output module 100 comprising a housing 102 constructed from inner and outer housing members 102a,102b that are interfitted with each other to define an enclosed interior space 104 in which one or more electronic circuit boards 106 is/are located. The inner and outer housing members 102a,102b are each preferably defined as one-piece molded polymeric constructions utilizing any of a wide variety of polymeric materials in an injection molding process. One suitable material is glass-filled polyester, although it is not intended that the development be limited to such material or any other material. One or more connectors 108 are operably connected to the circuit board 106 and project through a top face 110 of the outer housing member 102b so as to be adapted for mating with corresponding cable connectors from external input output devices or the like. The circuit boards 106 and connectors 108 are adapted for any desired electrical application such as input and output to/from an industrial process. A module 100 typically comprises a plurality of visual indicators such as light emitting diodes operably connected to a circuit board 106 and that provide visual output signals concerning the state of the circuitry 106 in the module 100 and/or flow of data or power or other signals. A light pipe includes lenses 114 that are aligned with and/or project through respective openings 116 in the top face 110 of the outer housing member 102b or other location of the housing 102 to communicate light from the LED's outside of the module 100.

The connectors 108, light pipe lenses 114 and any other openings in the outer housing member 102b are sealed against ingress of water, dirt or other contaminants to the interior space 104 using a potting compound PT that is applied into the outer housing member 102b after the various components such as the connectors and light pipe are installed. Often, multiple layers of potting compound PT are used and installed/cured in stages as components are correspondingly added in stages.

Potting compound PT is also used to seal the connection between the inner and outer housing members 102a,102b. In the illustrated example of FIG. 1, it can be seen that the inner housing member 102a is adapted for nesting within the outer housing member 102b and comprises a plurality of tabs 102T that are received in corresponding recesses 102R such as notches, or apertures defined by the outer housing member 102b so that the housing members 102a,102b are mechanically interlocked with a close snap-fit. Furthermore, the inner housing member 102a comprises a continuous peripheral wall 102W projecting outwardly therefrom that is received within a corresponding continuously extending peripheral groove 102G defined by the outer housing member 102b. The joint at the junction of the wall 102W and groove 102G is sealed with the potting compound PT.

Despite widespread commercial success, the module 100 of FIG. 1 has various drawbacks relating to the use of potting compound PT to provide the requisite ingress protection. Potted products cannot be disassembled and repaired. A batch of defective modules 100 must be discarded even if only a single component of each module is defective. Assembled modules 100 that are potted cannot be disassembled and reconfigured. The potting compound PT must be cured by passage of time and/or application of heat, neither of which is desirable in a manufacturing system. The potting compound PT is dense and adds significant weight to the product. The presence of potting compound PT also prevents recycling of the module 100.

With these and other concerns in mind, an industrial automation input output module with elastomeric sealing, and a method of constructing same, have been developed and are disclosed herein according to the present invention.

SUMMARY

In accordance with one aspect of the present development, an industrial automation input output module includes an outer housing member with a top housing wall and an outer peripheral housing wall. The top housing wall and the outer peripheral housing wall define an open recess. The outer housing member further includes an inner peripheral housing wall spaced from the outer peripheral housing wall. A groove is defined between the inner peripheral housing wall and the outer peripheral housing wall. An inner housing member is received in the open recess of the outer housing member so that the inner and outer housing members together define an interior space for containing at least one circuit board. The inner housing member includes a projecting seal engagement wall that is received in the groove. A one-piece elastomeric main seal is installed adjacent the groove. The main seal includes: (i) a lateral seal portion that provides a fluid-tight seal between an inner face of said seal engagement wall and the inner peripheral housing wall; and, (ii) a face seal portion located in the groove that provides a fluid-tight seal between a tip of the seal engagement wall and the outer housing member.

In accordance with another aspect of the present development, the industrial automation input output module further includes a visual indicator adjacent a visual indicator opening in the top housing wall. The one-piece elastomeric main seal further includes a light-pipe portion including a translucent light pipe adapted to communicate light from a light source located in the interior space of the module to the visual indicator opening.

In accordance with another aspect of the present development, an elastomeric seal comprises a one-piece body including a seal portion and a light pipe portion, said seal portion including a plurality of linear segments and a plurality of corners located respectively between the linear segments, wherein the linear segments and the corners define the main seal to have an open central portion. The light pipe portion includes a translucent light pipe having an inner end and an outer end, and the light pipe is adapted to communicate light from the inner end to the outer end thereof.

BRIEF DESCRIPTION OF DRAWINGS

FIG. 5 is a sectional view of the elastomeric seal as taken at location 5-5 of FIG. 4A;

DETAILED DESCRIPTION

Figure 1:
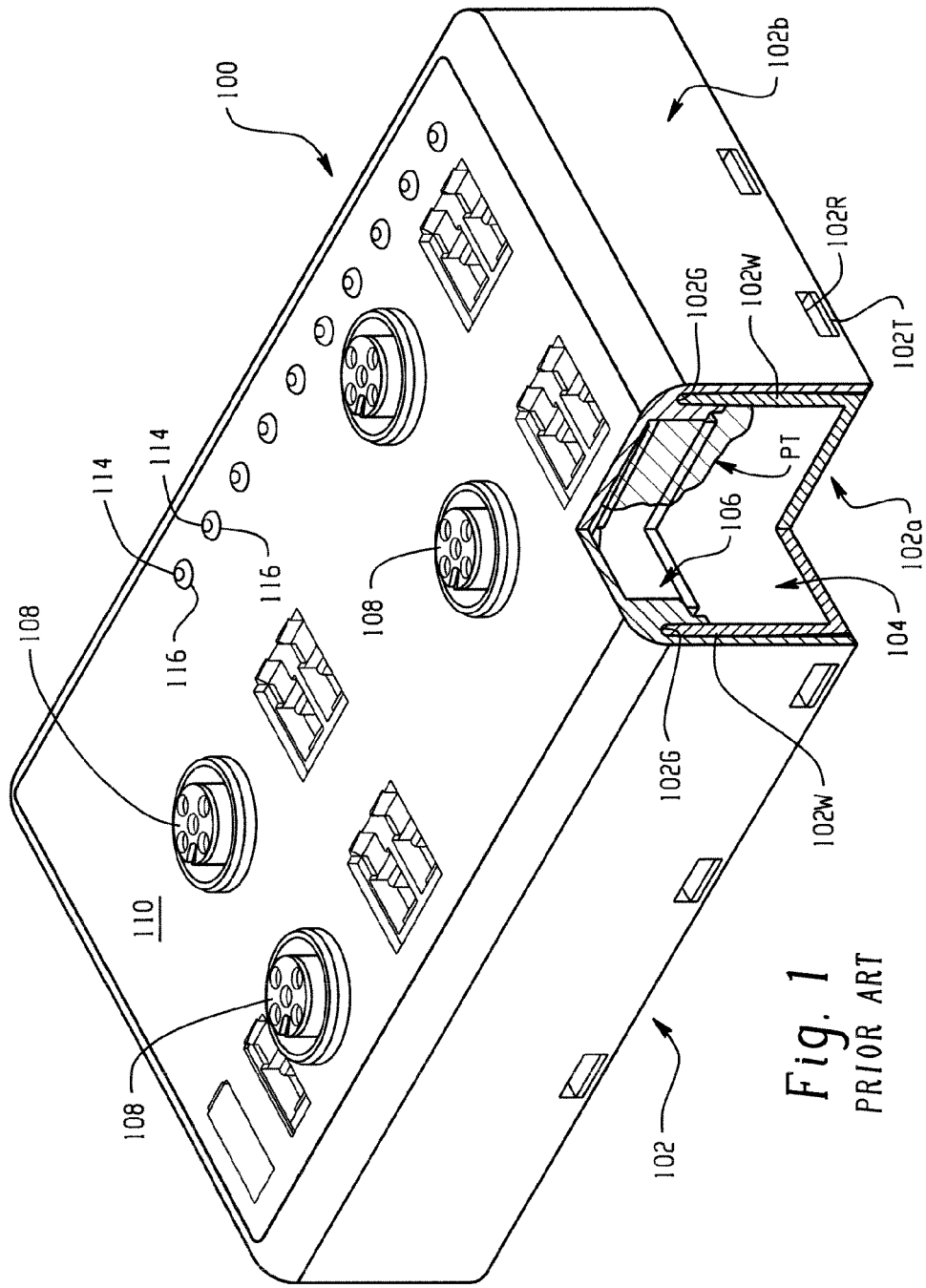
FIG. 1 is an isometric, partially sectioned view of a known industrial automation input output module.
Figure 2:
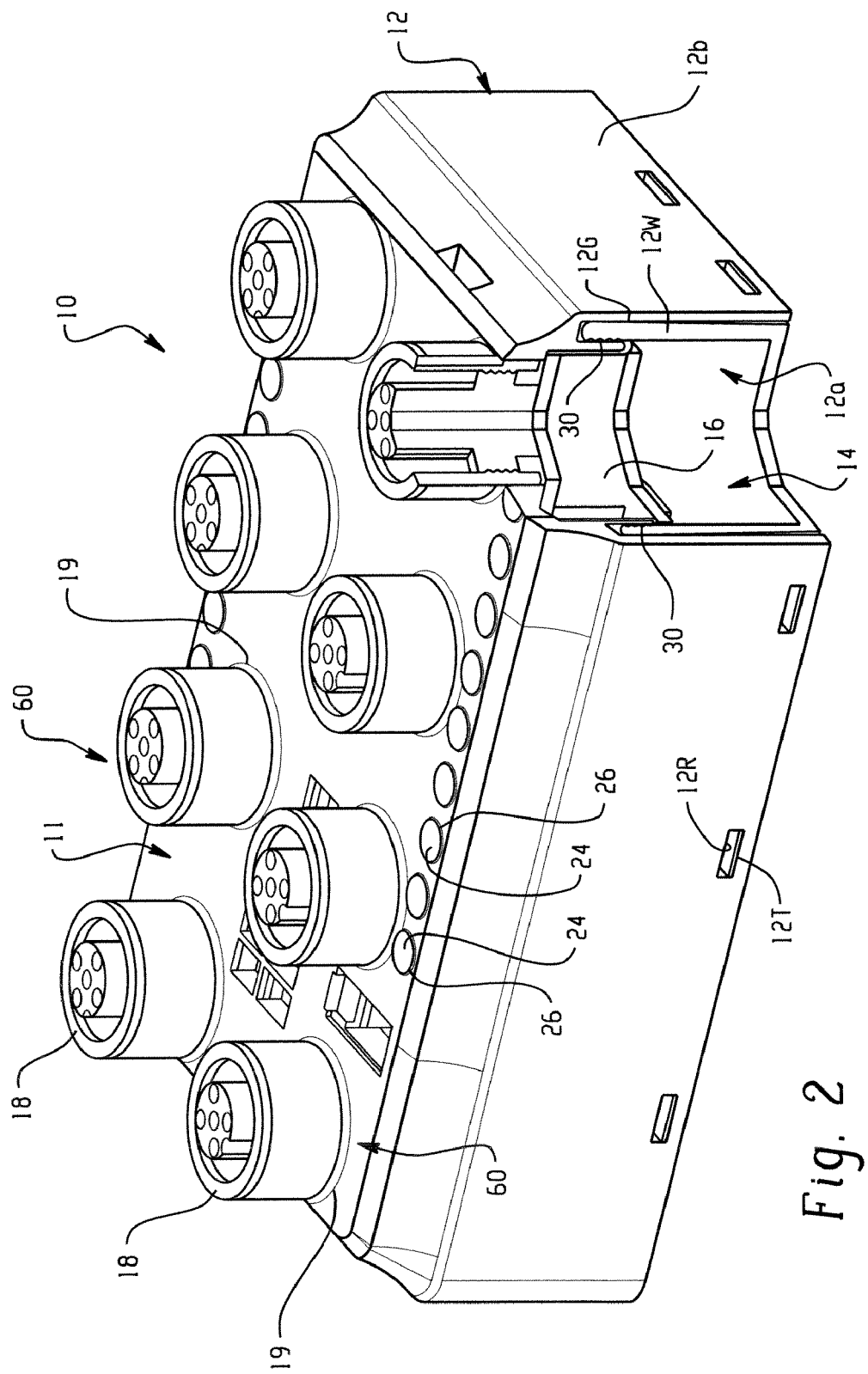
FIG. 2 is similar to FIG. 1 and provides an isometric view of an industrial automation input output module with elastomeric sealing formed in accordance with the present invention.

FIG. 2 shows an industrial automation input output module 10 that corresponds in terms of structure to the module 100 of FIG. 1, except that the potting compound PT of the module 100 of FIG. 1 is eliminated and replaced with a one-piece elastomeric seal 30 in accordance with the present invention. In some cases, the one or more connectors 18 of the module 10 are sealed to the housing with O-rings or other elastomeric seals, depending on the type of connector.

Similar to the module 100, the module 10 comprises a housing 12 constructed from inner and outer housing members 12a,12b that are inter-fitted with each other to define an enclosed interior space 14 in which one or more electronic circuit boards 16 is/are located. The inner and outer housing members 12a,12b are each preferably defined as one-piece molded polymeric constructions utilizing any of a wide variety of polymeric materials in an injection molding process. One suitable material is glass-filled polyester, although it is not intended that the development be limited to such material or any other material. The connectors 18 are operably connected to a circuit board 16 and project through a top wall 11 of the outer housing member 12b so as to be adapted for mating with corresponding cable connectors from external input output devices or the like. The circuit boards 16 and connectors 18 are adapted for any desired electrical application such as input and output to/from an industrial process. The module 10 comprises a plurality of visual indicators 24 that project through corresponding openings 26 in the outer housing member 12b that provide visual output signals concerning the state of the circuitry 16 in the module 10 and/or flow of data or power or other signals.

The housing member 12 is sealed against ingress of water, dirt or other contaminants using a main elastomeric seal 30 located between the inner and outer housing members 12a, 12b, and an elastomeric seal for each connector 18. As described herein, the visual indicators 24 are also sealed relative to the openings 26 in the outer housing member 12b, but remain visible outside of the housing member 12. As can be seen in FIG. 2, the inner housing member 12a is adapted for nesting within the outer housing member 12b and comprises a plurality of tabs 12T that are received in corresponding recesses 12R such as notches, or apertures defined by the outer housing member 12b so that the housing members 12a,12b are mechanically interlocked with a close snap-fit without requiring use of screws or other fasteners. The inner housing member 12a comprises a continuous peripheral wall 12W projecting outwardly therefrom that is received within a corresponding continuously extending peripheral groove 12G defined by the outer housing member 12b. According to the present invention, and unlike the known module 100 that uses potting compound, the joint at the junction of the wall 12W and groove 12G of the module 10 is sealed with the main elastomeric seal 30 to prevent ingress of water, dirt, and other contaminants at the interface between the wall 12W and groove 12G. As such, the wall 12W is sometimes referred to herein as a "seal engagement wall."

Figure 3:
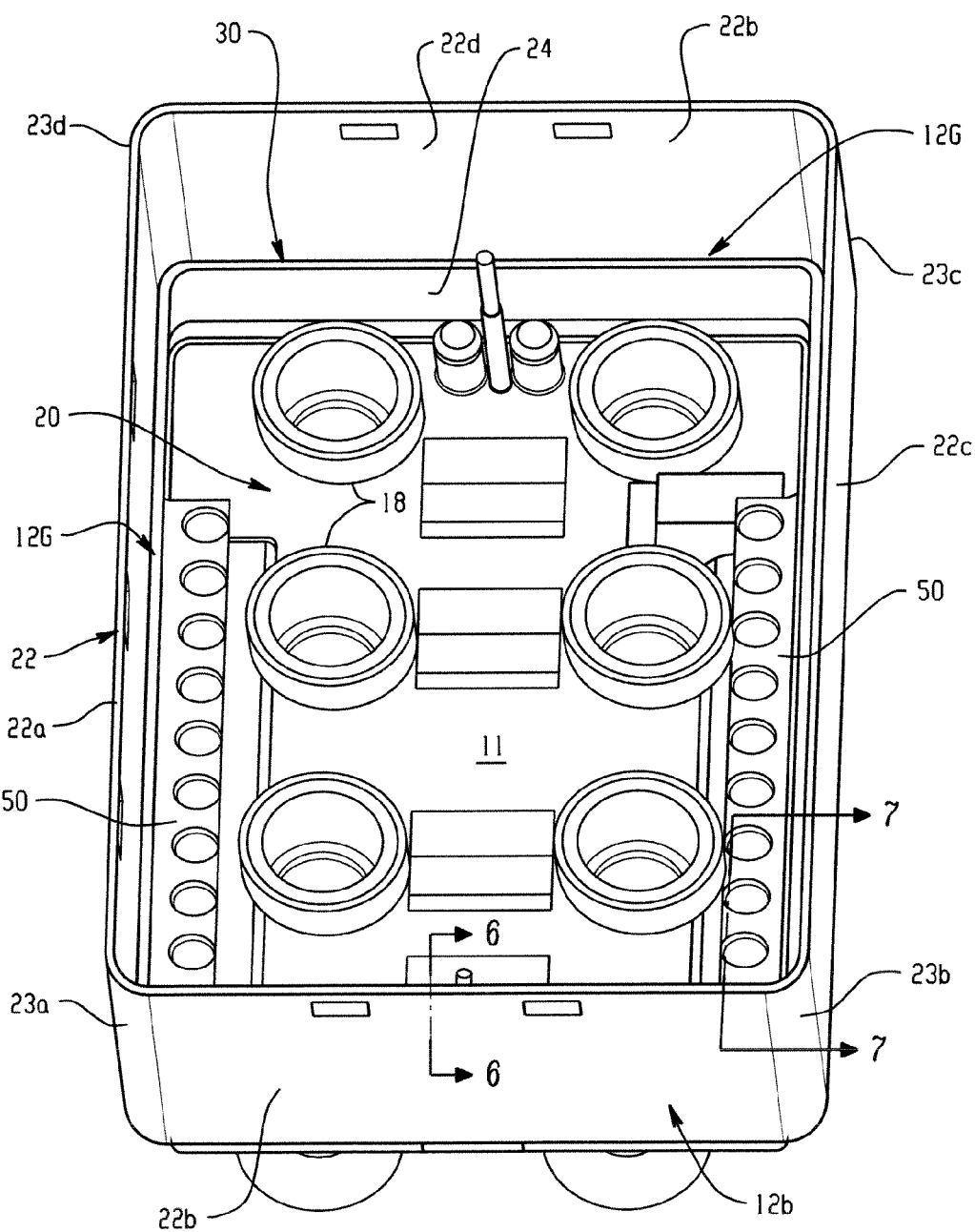
FIG. 3 is an isometric view of the bottom or open side of the outer housing member of the industrial automation input output module of FIG. 2, with internal components removed to review the elastomeric seal and sealed connectors.
Figure 6:
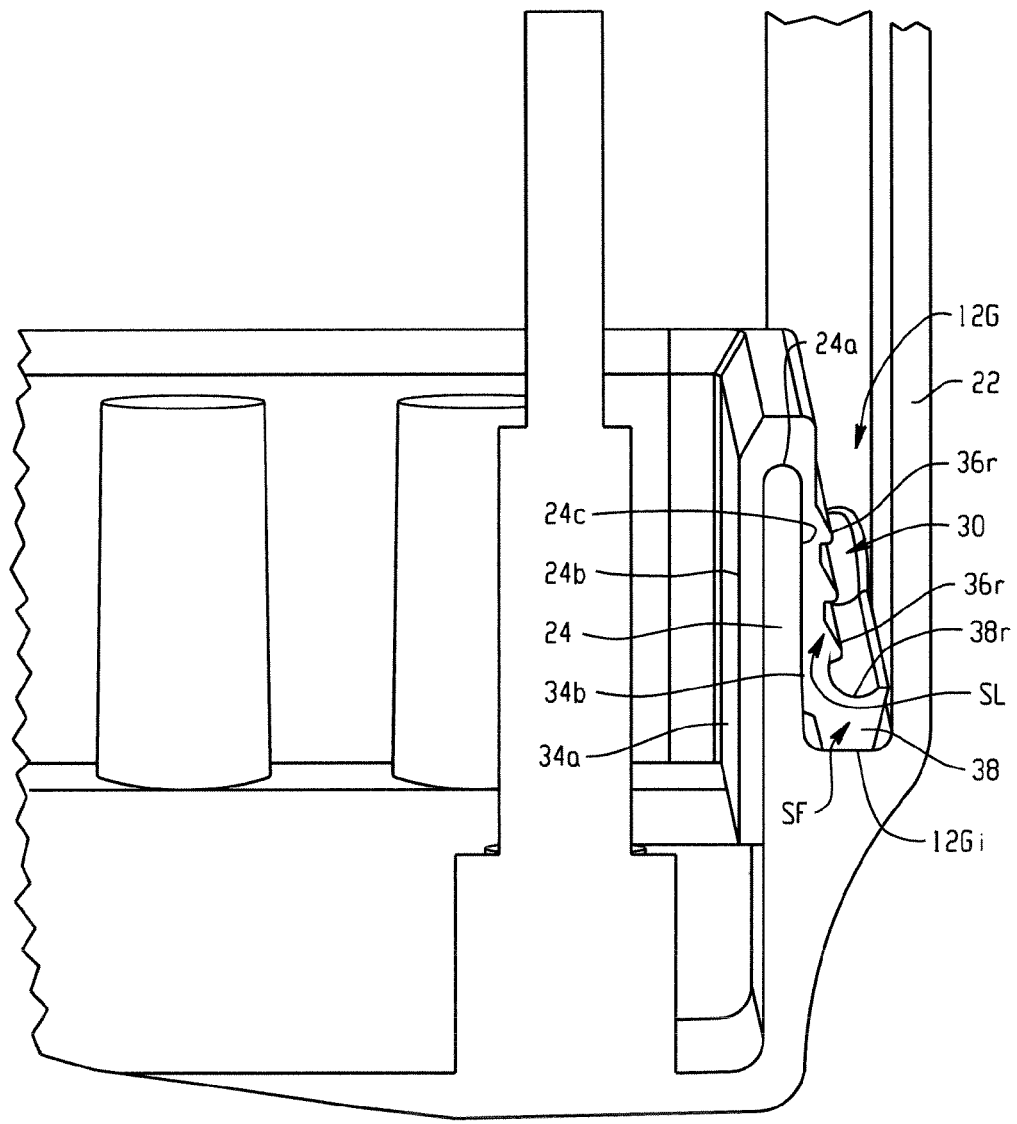
FIG. 6 is a sectional view of the outer housing member and installed elastomeric seal as taken at location 6-6 of FIG. 3.

FIG. 3 shows the outer housing member 12b by itself in an inverted state and with the circuit board(s) 16 and other components removed so that it can be seen that the outer housing member includes an open recess 20 defined by the top wall 11 and a plurality of side walls 22a,22b,22c,22d that project outwardly from the top wall 11 and that are connected to each other by corners 23a,23b,23c,23d so as to define a continuous outer peripheral wall structure 22. As described in full detail below, the connectors 18 project through respective openings 19 in the top wall 11 and are sealed using respective connector seals 70 (see FIG. 8). The groove 12G is defined between an inner face of the peripheral wall 22 and a correspondingly shaped but shorter second or inner wall 24 that is spaced inward from the peripheral wall 22 (see also FIG. 6). As shown in FIG. 6, this inner wall 24 comprises an outer edge 24a and first and second opposite faces 24b,24c and thus defines a mounting location for the main elastomeric seal 30.

Figure 4A:
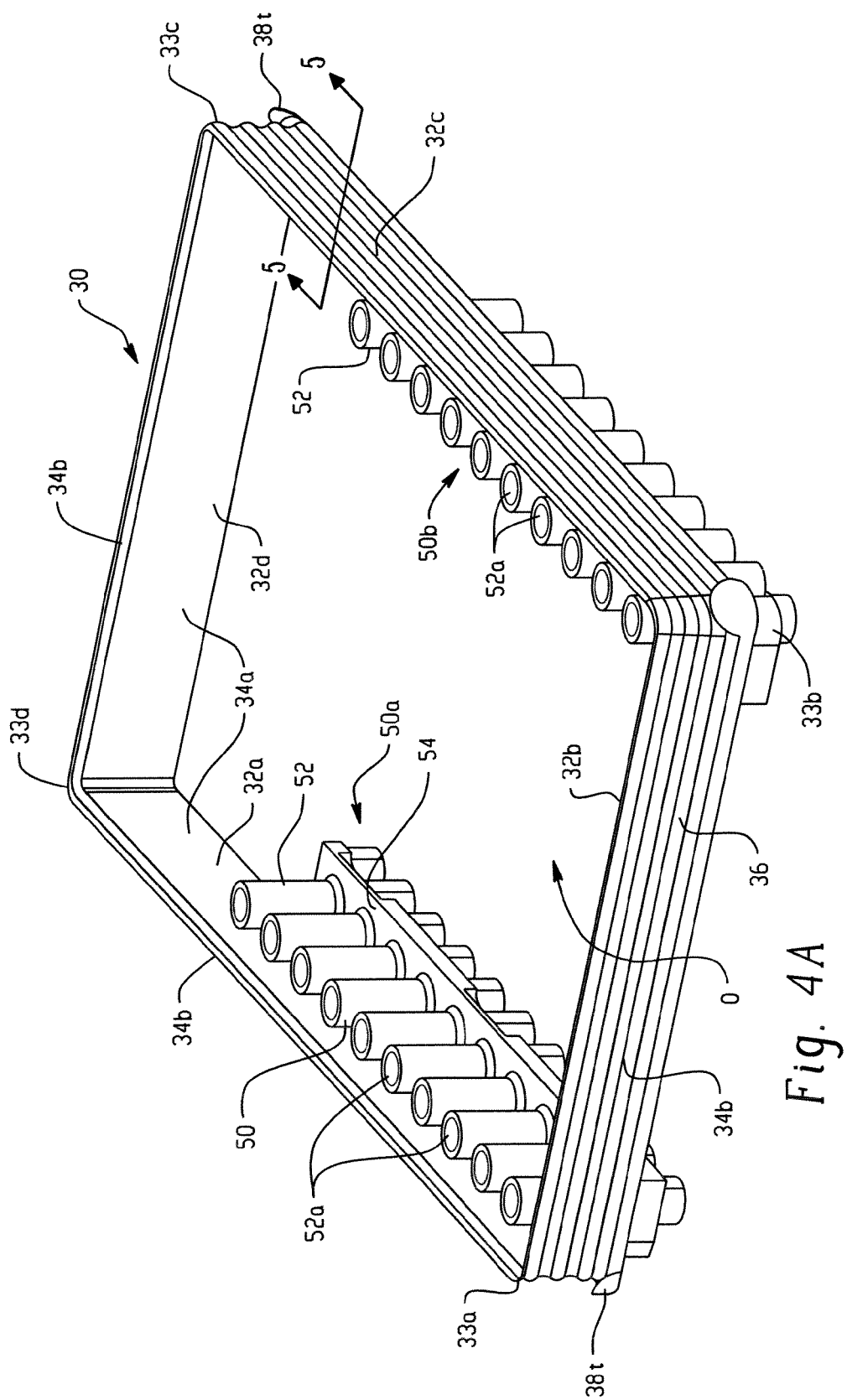
FIGS. 4A and 4B are lower and upper side isometric views of an elastomeric seal formed in accordance with the present invention and used in the module of FIG. 2.
Figure 4B:
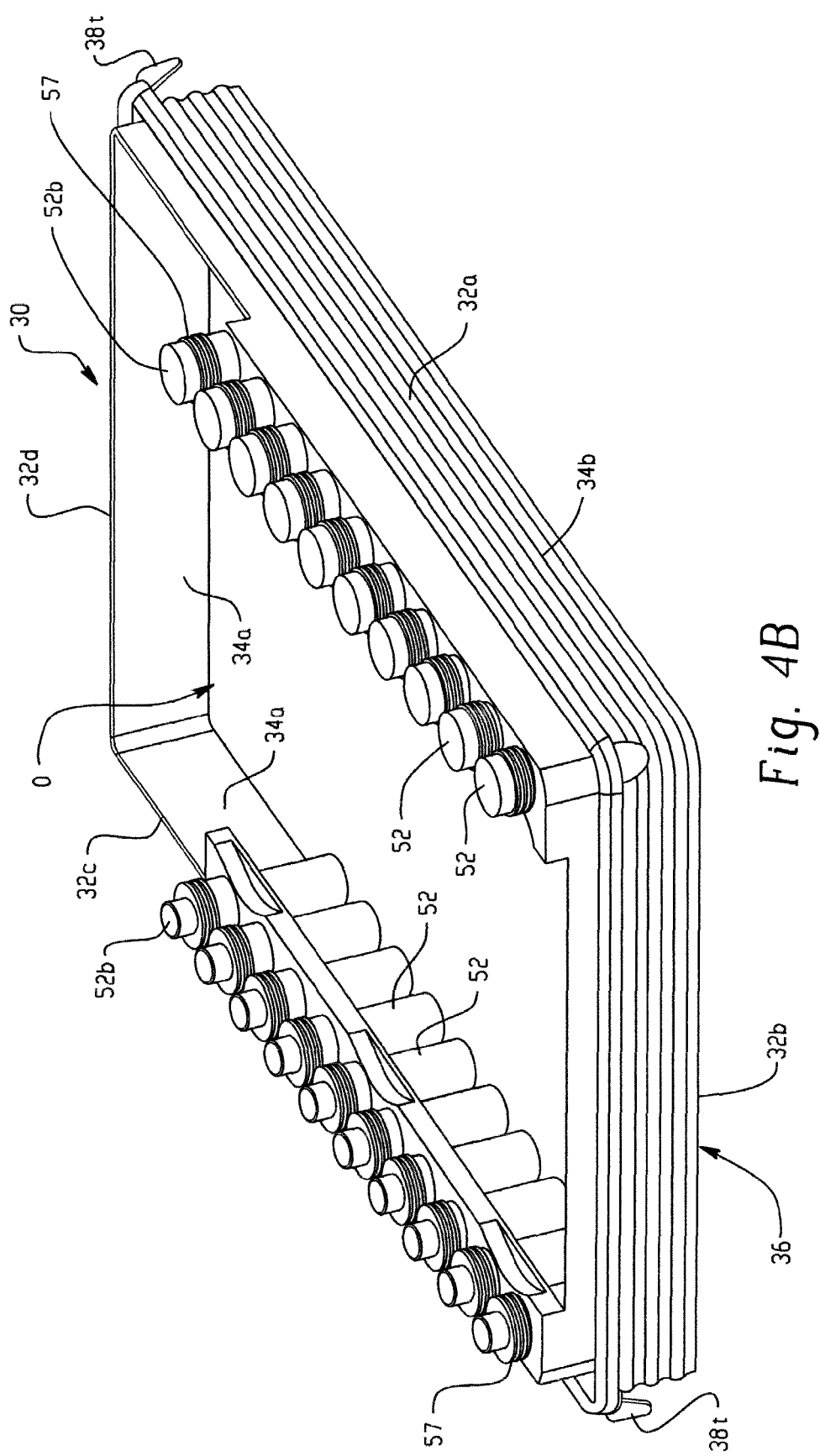

The main elastomeric seal 30, itself, is shown in FIGS. 4A, 4B, and 5 and comprises a one-piece molded elastomeric body defined from a suitable elastomer such as DuPont™ Vamac® ethylene acrylic elastomer (AEM) or a commercial grade silicone or any other compressible, resilient elastomeric composition suitable for seals (that is preferably also clear or at least translucent for light piping capability as disclosed below). The seal 30 is dimensioned and conformed so as to be adapted to seal the groove 12G of the outer housing member 12b, i.e., to seal the space between the seal engaging wall 12W of the inner housing member 12a and the groove 12G of the outer housing member 12b. Typically, as shown herein, the seal 30 defines an overall rectangular shape comprising four linear segments 32a,32b,32c,32d connected by corners 33a,33b,33c,33d. The linear segments 32a-32d and corners 33a-33d preferably define an open central portion O of the seal 30 therebetween to reduce material usage and to minimize the likelihood that the seal 30 will interfere with other components of the module 10, e.g., the connectors 18.

As is shown in FIG. 5, the linear segments 32a-32d and corners 33a,33d are defined by spaced apart inner and outer walls 34a,34b that are interconnected by an end wall 34c, wherein the inner and outer walls 34a,34b and end wall 34c define a U-shaped wall receiving structure adapted for close sliding receipt of the inner wall 24 of the outer housing member 12b as shown in FIG. 6, with the interface between the housing wall 24 and the seal walls 34a,34b being smooth and planar over at least a substantial portion of both opposite faces 24a,24b of the wall 24.

The outer seal wall 34b, located adjacent the groove 12G, comprises an outer face 36 that provides a lateral seal portion SL. This outer face 36 preferably defines one or more sealing ribs 36r that extend parallel to the outer and inner walls 22,24 and parallel to the groove 12G. The sealing ribs 36r preferably define a saw-tooth cross-section, with a ramp surface 36a that diverges from the seal wall 34b as it extends away from the end wall 34c, which facilitates insertion of the seal engagement wall 12W of the inner housing member into the groove 12G when the module 10 is assembled and which also tends to improve sealing in response to any fluid pressure being exerted on the ribs 36r toward the interior space 14 of the module 10. The sealing ribs 36r engage and are compressed by an inner surface 12Wi of the wall 12W when the wall 12W is inserted in the groove 12G as shown in FIG. 7.

Figure 7:
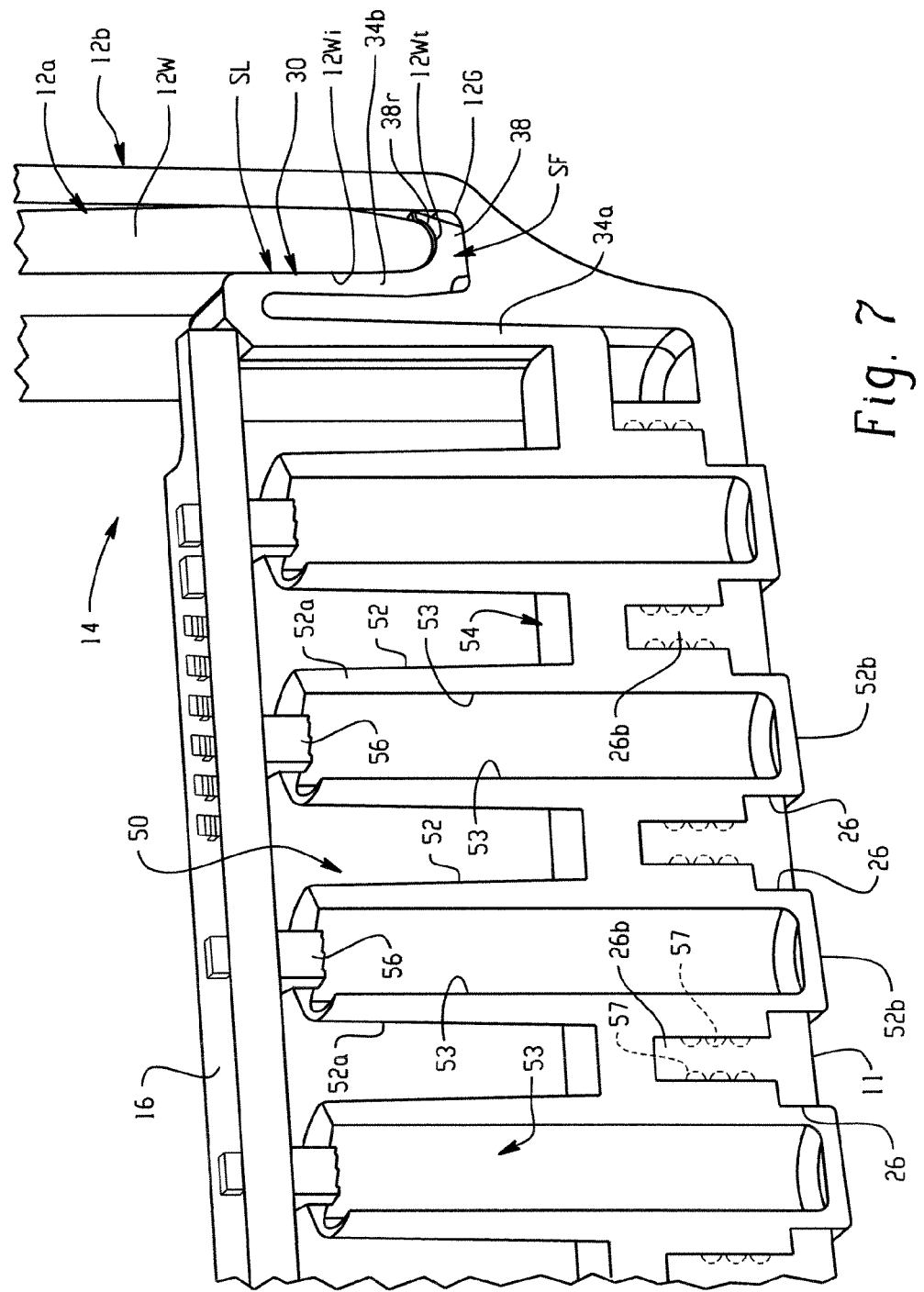
FIG. 7 is a section view of the outer housing member and installed elastomeric seal as taken at location 7-7 of FIG. 3, and also shows the inner housing member and an installed circuit board including LED's.

With continuing reference to FIGS. 5-7, the seal 30 further comprises a face seal portion SF defined by a lip 38 that projects transversely outward from the seal outer wall 34b away from the inner wall 34a at a location spaced from the end wall 34c so as to be located in the groove 12G, in abutment with an inner wall 12Gi of the groove that extends between and interconnects the walls 22,24 of the outer housing member 12b. The lip 38 of the face seal portion SF defines an outwardly facing recess 38r that opens upwardly away from the inner wall 12Gi of the groove 12G so as to be adapted for receipt of a tip 12Wt of the wall 12W of the inner housing portion 12a when the inner and outer housing portions 12a, 12b are inter-fitted to define the module housing 12 as shown in FIG. 7. At least at each of the corners 33a-33d of the seal, the lip 38 further comprises an upwardly projecting tab 38t that projects upwardly away from the recess 38r at a location spaced from the seal outer wall 34b. The seal engagement wall 12W of the inner housing member 12a is received between the seal outer wall 34b and each tab 38t, and the tabs 38t ensure a fluid-tight seal between the corners 23a,23b,23c, 23d of the outer housing wall 22 and the corresponding adjacent corners of the seal engagement wall 12W of the inner housing 12a when the inner housing 12a is installed in the outer housing 12b. As such, the tabs 38t ensure a fluid-tight seal at the corners 23a-23d which can otherwise be prone to leaks.

The main elastomeric seal 30 preferably includes at least one integral light-pipe portion 50 as part of its one-piece construction. With particular reference to FIGS. 4A, 4B and 7, the light pipe portion 50 is defined as part of the one-piece seal construction from the same material and comprises at least one light pipe 52 which is transparent or at least translucent, depending upon the material from which the seal 30 is defined. As shown herein, a base wall 54 is connected to the seal inner wall 34a and extends transversely inward toward a center of the seal 30, and each light pipe 52 is connected to the base wall 54. As shown, the seal 30 comprises two light pipe portions 50a,50b of like construction located on opposite sides of the seal opening O, each comprising a plurality of light pipes 52.

Each light pipe 52 is adapted to communicate light from a light source such as an LED or other light source located inside the space 14 of the module 10 to a location adjacent one of the visual indicator openings 26 of the outer housing member 12b. More particularly, as shown in FIG. 7, each light pipe 52 comprises an inner end 52a and an outer end 52b. The inner end 52a is adapted to be positioned in abutment with or otherwise adjacent an LED or other light source 56 connected to a circuit board 16 or other location in the module 10. The outer end 52b is adapted to be located adjacent and tightly received in one of the visual indicator openings 26 of the outer housing member 12b and preferably project entirely through the opening 26 so that the outer end 52b defines the visual indicator 24, while a fluid-tight seal is maintained between the light pipe 52 and the outer housing member 12b. As shown, each visual indicator opening 26 is surrounded by a respective visual indicator boss 26b that is part of the outer housing member 12b and that includes a cylindrical inner surface. The outer end 52b of each light pipe comprises one or more radially projecting sealing ribs 57 that engage the corresponding visual indicator boss 26b with a fluid-tight fit as shown in FIG. 7 (note that in FIG. 7, the ribs 57 are shown in broken lines to indicate that they are compressed between the light pipe 52 and the visual indicator boss 26b. As also shown in FIG. 7, it is most preferred that each light pipe 52 comprise a hollow tube structure including a bore 53 closed at the outer end 52b but otherwise open from the closed end 52b to and through the inner end 52a. The open, tubular bore 53 of the light pipe maximizes communication of light from the light source 54 to the closed outer end 52b of the light pipe, whereas a solid mass of the elastomeric seal material would lead to light losses, scattering and/or dissipation. The bore 53 also facilitates injection molding of the one-piece main seal 30. The main seal 30, including the light pipe portion 50 can alternatively be made integral to the outer housing member 12b using a transfer or insert molding process, in which the main seal 30 becomes permanently bonded to and/or defined as part of the outer housing member 12b.

Figure 8:
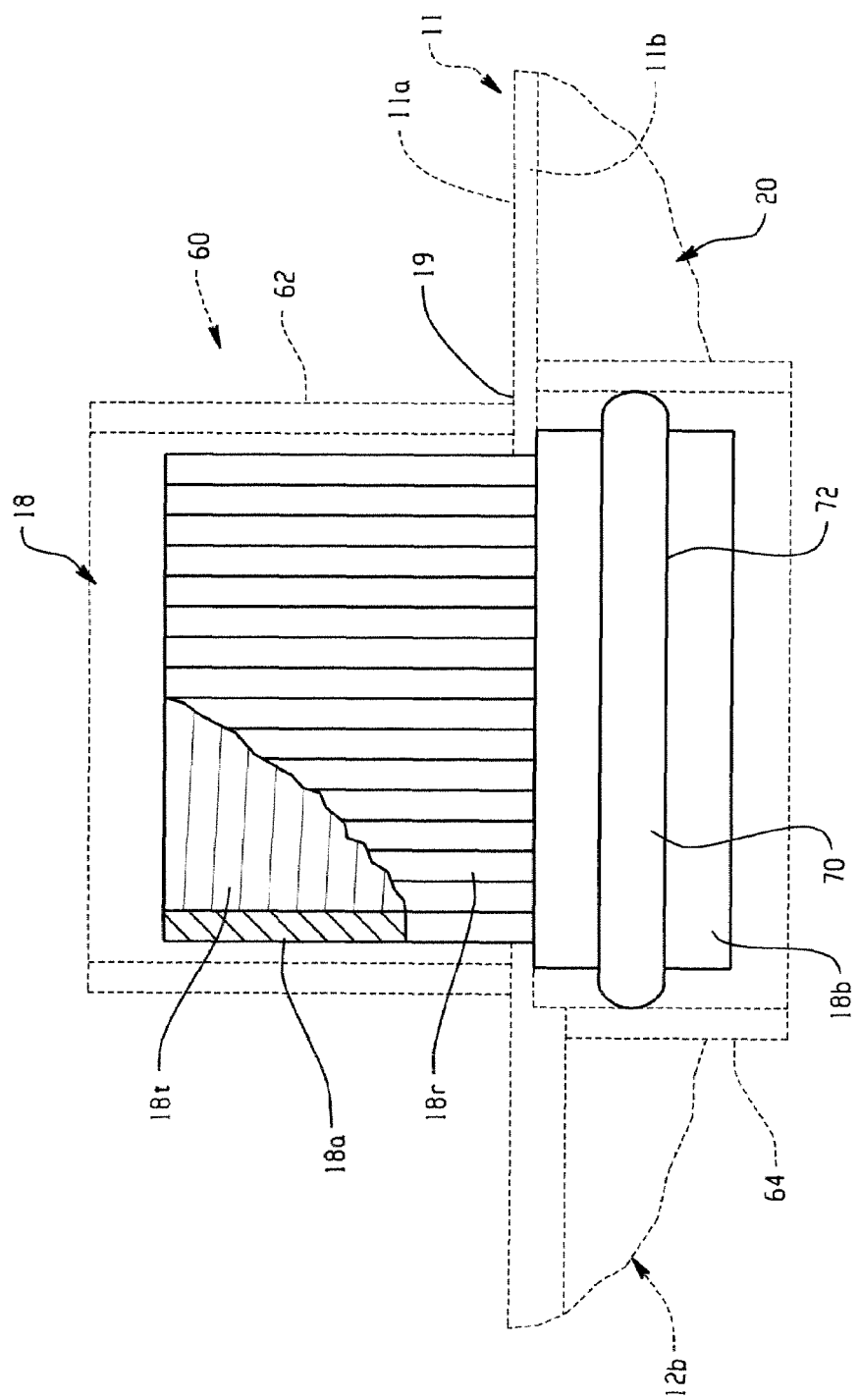
FIG. 8 illustrates a connector installed into the outer housing member using an o-ring seal and a torsion resistant connection in accordance with the present invention.

As noted, one or more connectors 18 project through respective openings 19 in the outer housing member 12b as shown in FIGS. 2 and 3. As such, each connector 18 must be sealingly engaged with the outer housing member 12b to prevent ingress of water and other contaminants to the interior space 14 between the connector 18 and outer housing member 12b as required by the IP65/IP67 or other comparable standard. As such, each connector 18 is sealed to the outer housing member 12b using an O-ring or like seal 70 as shown in FIG. 8. In particular, the top wall 11 of the outer housing member 12b includes one or more connector mounting locations 60 corresponding in number to the number of connectors 18 for the module 10. Each connector mounting location 60 is defined by a connector opening 19 in the top wall 11, an outer boss 62 that projects from an outer surface 11a of the top wall and that encircles the opening 19, and an inner boss 64 that also encircles the opening 19 but projects from an opposite inner surface 11b of the top wall 11 into the open recess 20 of the outer housing member 12b. The outer and inner bosses 62,64 each comprise a cylindrical inner surface.

The connector 18 is inserted into the connector mounting location 60, from inside the open recess 20 of the outer housing member 12b, so that the connector extends through the opening 19 with an outer portion 18a of the connector tightly fit into the outer boss 62 and an inner portion 18b of the connector tightly fit into the inner boss 64. The inner portion 18b of the connector comprises an elastomeric O-ring seal 70 seated in a circumferential groove 72, and the seal 70 engages the inner boss 64 with a fluid-tight fit. The connectors 18 are typically metallic and can be any of a wide variety of well known connectors. As shown, the connectors 18 adapted for threaded connection with a mating cable connector and, as such, each comprise an internally threaded portion 18t. Because the connectors 18 are subjected to torsional stresses during threaded connection/disconnection of an associated cable, each connector 18 includes means for preventing rotation of the connector relative to the connector mounting location 60. As shown, the outer portion 18a of each connector includes a plurality of vertical or otherwise configured ribs 18r so that a knurled outer surface is defined which frictionally engages the outer cylindrical boss 62 to inhibit rotation of the connector 18. It is preferred that the knurled outer surface defined by the ribs 18r be bonded to the outer cylindrical boss, e.g., by ultrasonic welding or an adhesive or the like.

The invention has been described with reference to preferred embodiments. Modifications and alterations will occur to those of ordinary skill in the art, and it is intended that the claims be construed literally and/or according to the doctrine or equivalents to encompass all such modifications and alterations to the fullest possible extent.

The invention claimed is:

1. An industrial automation input output module comprising:

an outer housing member comprising a top housing wall and an outer peripheral housing wall, said top housing wall and outer peripheral housing wall defining an open recess, said outer housing member further comprising an inner peripheral housing wall spaced from said outer peripheral housing wall, wherein a groove is defined between said inner peripheral housing wall and said outer peripheral housing wall;

an inner housing member that is received in said open recess of said outer housing member so that said inner and outer housing members together define an interior space for containing at least one circuit board, said inner housing member comprising a projecting seal engagement wall that is received in said groove;

a one-piece elastomeric main seal installed adjacent said groove, said main seal comprising: (i) a lateral seal portion that provides a fluid-tight seal between an inner face of said seal engagement wall and said inner peripheral housing wall; and, (ii) a face seal portion located in said groove that provides a fluid-tight seal between a tip of said seal engagement wall and said outer housing member;

a connector mounting location comprising: (i) a connector opening defined in said top housing wall; (ii) an inner boss that projects from an inner side of said top housing wall and that surrounds said connector opening; and, (iii) an outer boss that projects from an outer side of said top housing wall and that surrounds said connector opening;

a connector installed in said connector opening, said connector comprising: (i) an outer portion that is frictionally engaged with said outer boss to inhibit rotation of said connector relative to said outer boss; and, (ii) an inner portion including an elastomeric connector seal seated in a groove, said connector seal engaging both said connector inner portion and said inner boss to provide a fluid-tight seal between said connector inner portion and said inner boss.

2. The industrial automation input output module as set forth in claim 1, wherein said outer portion of said connector comprises a knurled surface that is bonded to said outer boss.

3. An industrial automation input output module comprising:

an outer housing member comprising a top housing wall and an outer peripheral housing wall, said top housing wall and outer peripheral housing wall defining an open recess, said outer housing member further comprising an inner peripheral housing wall spaced from said outer peripheral housing wall, wherein a groove is defined between said inner peripheral housing wall and said outer peripheral housing wall;

an inner housing member that is received in said open recess of said outer housing member so that said inner and outer housing members together define an interior space for containing at least one circuit board, said inner housing member comprising a projecting seal engagement wall that is received in said groove;

a one-piece elastomeric main seal installed adjacent said groove, said main seal comprising a plurality of linear segments and a plurality of corners located respectively between said linear segments wherein said linear segments and said corners define said main seal to have an open central portion, each of said linear segments comprising a seal inner wall, a seal outer wall, and a seal end wall that connects said seal inner wall to said seal outer wall so that said seal inner wall, said seal outer wall, and said seal end wall define a U-shaped structure in which said inner peripheral housing wall is positioned, said main seal further comprising: (i) a lateral seal portion defined by said seal outer wall that provides a fluid-tight seal between an inner face of said seal engagement wall and said inner peripheral housing wall; and, (ii) a face seal portion located in said groove that provides a fluid-tight seal between a tip of said seal engagement wall and said outer housing member.

4. The industrial automation input output module as set forth in claim 3, wherein said lateral seal portion comprises at least one sealing rib projecting from said seal outer wall and that extends parallel to said groove.

5. The industrial automation input output module as set forth in claim 4, wherein said sealing rib defines a saw-tooth cross-section including a ramp surface that diverges from said seal outer wall as it extends away from said seal end wall.

6. The industrial automation input output module as set forth in claim 3, wherein said face seal portion of said main seal is defined by a lip that projects transversely outward from said sea outer wall.

7. The industrial automation input output module as set forth in claim 6, wherein said lip of said main seal is abutted with an inner wall of said groove and comprises a recess that opens upwardly away from said inner wall of said groove.

8. The industrial automation input output module as set forth in claim 6, wherein said lip comprises a plurality tabs that project outwardly therefrom and located respectively at said plurality of corners, spaced from said seal outer wall, wherein said seal engagement wall of said inner housing member is located between said seal outer wall and each of said tabs.

9. An industrial automation input output module comprising:

an outer housing member comprising a top housing wall and an outer peripheral housing wall, said top housing wall and outer peripheral housing wall defining an open recess, said outer housing member further comprising an inner peripheral housing wall spaced from said outer peripheral housing wall, wherein a groove is defined between said inner peripheral housing wall and said outer peripheral housing wall;

an inner housing member that is received in said open recess of said outer housing member so that said inner and outer housing members together define an interior space for containing at least one circuit board, said inner housing member comprising a projecting seal engagement wall that is received in said groove;

a one-piece elastomeric main seal installed adjacent said groove, said main seal comprising: (i) a lateral seal portion that provides a fluid-tight seal between an inner face of said seal engagement wall and said inner peripheral housing wall; and, (ii) a face seal portion located in said groove that provides a fluid-tight seal between a tip of said seal engagement wall and said outer housing member;

a visual indicator adjacent a visual indicator opening in said top housing wall, wherein said one-piece elastomeric main seal further comprises:

a light-pipe portion comprising a translucent light pipe adapted to communicate light from a light source located in said interior space of said module to said visual indicator opening.

10. The industrial automation input output module as set forth in claim 9, wherein a portion of said light pipe defines said visual indicator.

11. The industrial automation input output module as set forth in claim 9, wherein said light pipe comprises an inner end located adjacent said light source and an outer end located adjacent said visual indicator opening.

12. The industrial automation input output module as set forth in claim 11, wherein said outer housing member comprises a visual indicator boss surrounding said visual indicator opening, and wherein said outer end of said light pipe comprises a sealing rib that projects outwardly therefrom and that engages said visual indicator boss with a fluid-tight seal.

13. The industrial automation input output module as set forth in claim 11, wherein said light pipe outer end defines said visual indicator.

14. The industrial automation input output module as set forth in claim 11, wherein said outer end of said light pipe projects through said visual indicator opening and said light pipe is sealingly engaged with said outer housing member to prevent ingress of fluid to said interior space between said light pipe and said outer housing member.

15. The industrial automation input output module as set forth in claim 14, wherein said light pipe comprises a hollow, tubular structure having a bore that extends from and through said inner end toward said outer end, wherein said outer end of said bore is closed.

16. The industrial automation input output module as set forth in claim 14, wherein said light pipe outer end defines said visual indicator.

* * * * *